United States Patent [19]

Martin, Jr. et al.

[11] Patent Number: 4,988,405
[45] Date of Patent: Jan. 29, 1991

[54] FABRICATION OF DEVICES UTILIZING A WET ETCHBACK PROCEDURE

[75] Inventors: Edward P. Martin, Jr., Bethlehem, Pa.; Ronald J. Schutz, Warren; Gerald Smolinsky, Madison, both of N.J.

[73] Assignee: AT&T Bell Laboratories, Murray Hill, N.J.

[21] Appl. No.: 454,088

[22] Filed: Dec. 21, 1989

[51] Int. Cl.⁵ .......................................... H01L 21/265
[52] U.S. Cl. .................................. 156/657; 156/662; 252/79.3; 437/61; 437/228; 437/231
[58] Field of Search ..................... 437/61, 228, 231; 156/662, 657; 252/79.3

[56] References Cited

U.S. PATENT DOCUMENTS

| 4,732,658 | 3/1988 | Lee | 156/662 |
| 4,752,505 | 6/1988 | Arac | 437/228 |
| 4,775,550 | 10/1988 | Chu et al. | 156/653 |
| 4,806,504 | 2/1989 | Cleeves | 437/228 |
| 4,826,786 | 5/1989 | Merenda et al. | 437/231 |
| 4,885,262 | 12/1989 | Ting et al. | 437/228 |

FOREIGN PATENT DOCUMENTS 0260038 10/1988 Japan ................................ 437/231

OTHER PUBLICATIONS

A. C. Adams, *VLSI Technology*, 2nd ed., S. M. Sze, editor, McGraw-Hill, New York, 1988, Chapter 6.
L. F. Thompson and M. J. Bowden, *Introduction to Microlithography*, L. F. Thompson, et al., editors, ACS Symposium Series 219, American Chemical Society, Washington, D.C., 1983, Chapter 4.
Sze, supra, Chapters 4 and 5.

*Primary Examiner*—David A. Simmons
*Assistant Examiner*—Thi Dang
*Attorney, Agent, or Firm*—B. S. Schneider

[57] ABSTRACT

Smoothing irregularities in a surface is accomplished by a wet-etchback technique. In this technique, a polysilicate composition is formed on a nonplanar substrate such as the surface of an integrated-circuit wafer. The polysilicate is etched away and the etching is continued into the underlying surface. As a result, a substantial smoothing of the surface is obtained.

6 Claims, 3 Drawing Sheets

FABRICATION OF DEVICES UTILIZING A WET ETCHBACK PROCEDURE

BACKGROUND OF THE INVENTION

1. Field of the Invention

This invention relates to device manufacture and, in particular, to device manufacture involving an etching procedure.

2. Art Background

During the fabrication of devices such as silicon integrated circuits, especially at design rules finer than 1 μm, it is often desirable to smooth, i.e. locally planarize, a relatively nonplanar surface. For example, the formation of active devices in the n and p tubs of a CMOS device configuration yields a relatively nonplanar surface. An oxide such as a chemical vapor deposition (CVD) oxide formed from a tetraethoxysilane (TEOS) precursor is deposited on this surface to electrically isolate it from an overlying metal interconnect pattern. The resulting deposited layer also has a nonplanar surface corresponding to that of the underlying layers. (Underlying refers to a material closer to the original substrate). The required subsequent deposition and patterning of an aluminum layer on this relatively irregular surface is difficult at design rules in the range 1 μm and essentially unacceptable at design rules finer than 0.8 μm. Therefore, it is desirable or essential to smooth the surface to produce an overlying aluminum pattern of appropriate configuration.

One typical procedure used for smoothing involes plasma etchback. In this process, a material with similar plasma etching characteristics to the layer being smoothed is deposited in a sufficiently thick layer to yield a smoothed upper surface. (A smoothed upper surface in the context of this disclosure has, over at least 90% of the area being smoothed, a surface that does not deviate more than 10 degrees, lesser included angle, from an imaginary plane parallel to the surface of the substrate before device processing.) The composite structure is then plasma etched; etching is continued until the entire smoothing layer is removed. Since the smoothing material and the underlying material are etched at essentially the same rate, the surface of the underlying material after essentially total removal of the smoothing layer takes on a surface configuration similar to the exposed surface of the smoothing material before etching, that is, the smooth surface of the smoothing layer is transferred by plasma etching to the underlying region.

Plasma etching is employed since materials typically employed for etchback smoothing are polymers such as novolac photoresists that have a similar etching rate in a plasma, e.g. a plasma containing fluorine and oxygen entities, to typical underlying material such as phosphorus and/or boron-doped CVD oxide. Despite the acceptable results by plasma etchback smoothing, this procedure requires the relatively large capital investment and maintenance costs associated with plasma etching equipment. Further, polymer smoothing materials often contain low levels of ionic impurities that tend to remain after plasma removal and require a subsequent cleaning procedure with its concomitant cost. Additionally, localized effects associated with plasma etching of organic materials generally yield ethcing-rate non-uniformities of typically 5% or more across a wafer and from wafer to wafer resulting in either under or over etching of the underlying layer. Thus, the etchback procedure as presently practiced has certain disadvantages.

SUMMARY OF THE INVENTION

It has been found that by using wet etching in an etchback smoothing procedure, excellent smoothing of an underlying region is obtained without the capital investment associated with plasma etching equipment and without the use of polymer materials. For example, the use of polysilicates in a wet etchback procedure to smooth materials such as oxide materials, e.g. phosphorus-doped CVD oxides formed by using a TEOS precursor, yields excellent smoothing results. For example, nonplanarities in the form of features with heights on the order of 7000–9000 Å used in either high or low density configurations are smoothed. Wet etchants such as buffered or unbuffered aqueous HF, and polysilicates such as sols of silicon oxide are exemplary of compositions employed.

DETAILED DESCRIPTION

Figure 1:
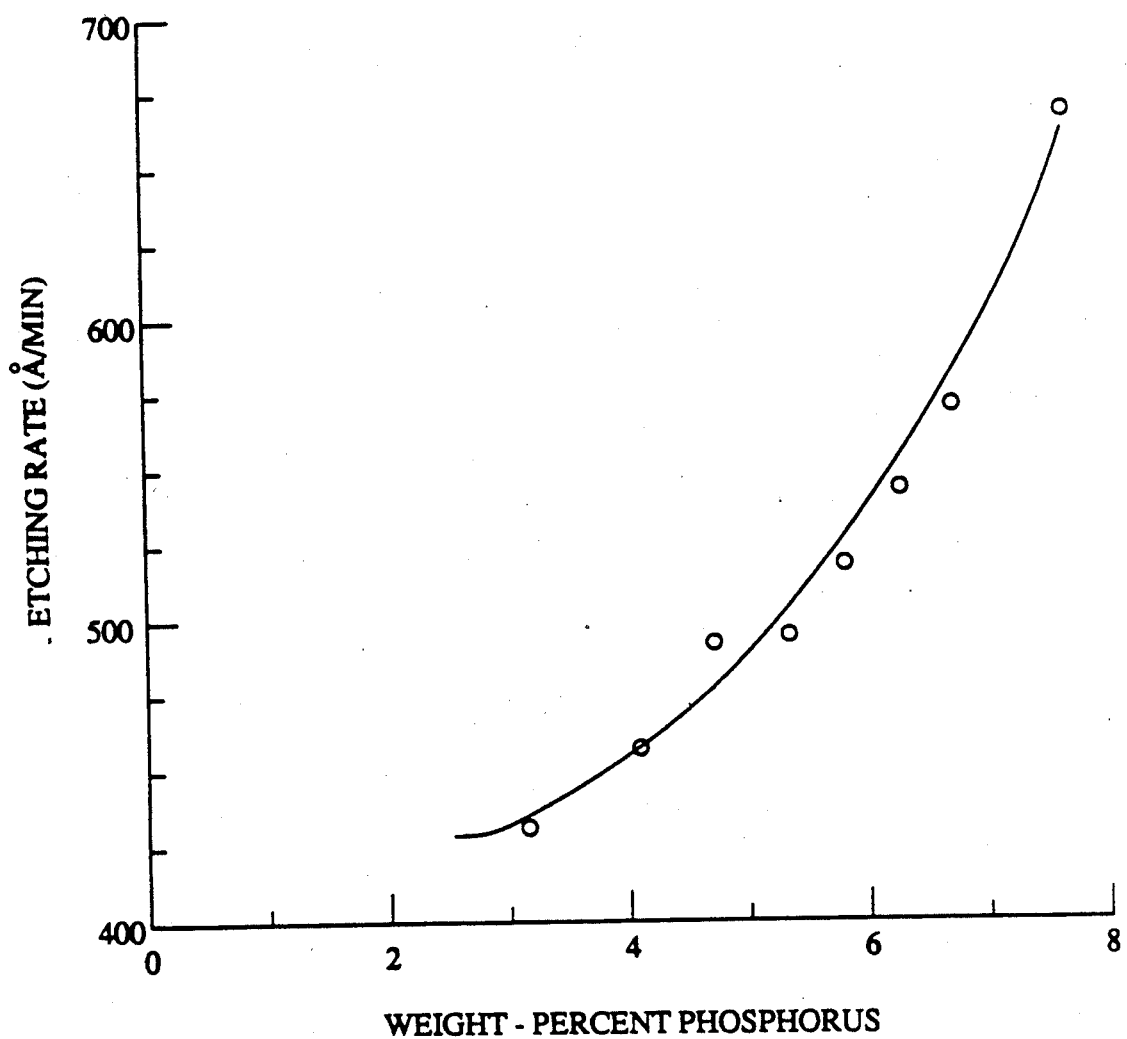
FIGS. 1–3 are illustrative of properties involved in the invention.

Excellent smoothing is achieved through a wet etching procedure using, for example, polysilicates as a smoothing material. It is desirable to match the etching rate of the smoothing material, e.g. the polysilicate, to the etching rate of the underlying material to be smoothed, e.g. the underlying oxide material. The degree of matching desired between the smoothing layer and the underlying layer depends on the particular device configuration. Typically, the etching rate of the smoothing layer should not differ from that of the underlying layer by more than 20% to avoid inadequate smoothing. In certain situations, such as where the smoothing of a narrow isolated feature is of paramount importance, it is desirable for the smoothing material to have a faster etching rate than the underlying material, and in certain situations such as where unwanted notch-like features are present in the material being smoothed, it is desirable for the smoothing material to have a slower etching rate.

Exemplary smoothing materials such as polysilicate materials that yield suitable etching rates for underlying layers such as CVD deposited oxides are sols of silicon oxides in low-molecular-weight polar solvents. (A sol is a colloidal suspension of silicon and oxygen containing material). A control sample is employed to determine a suitable smoothing material for a desired underlying layer. However, polysiloxanes have wet-etching rates that are much too fast compared to those of typical underlying materials and are not suitable as a smoothing layer. This shortcoming is due to a less extensive silicon/oxygen network characterized by the presence of organic moieties bound to the silicon. For example, for etching with an aqueous solution including 30 parts by volume $NH_4F$ (40 weight % in water) and 1 part HF (49 weight % in water) of an underlying material such as phosphorus-doped CVD oxide formed from a TEOS precursor, silicate etching rates in the range 350 to 650 Å/min are used at 20° to 25° C.

The composition of the underlying material strongly affects its etching rate and thus the smoothing process. For example, increased phosphorus dopant increases the etching rate of a CVD oxide material. Since the polysilicates typically have an etching rate somewhat higher than undoped underlying oxides, it is desirable to add sufficient dopant such as phosphorus to slightly enhance the etching rate of the underlying material when polysilicate smoothing material is used. Typically, dopant concentrations in the range 3 to 6 weight percent are employed in CVD TEOS oxide to yield the desired enhancement. Dopant concentrations less than 3% yield an insubstantial increase in etching rate while dopant concentrations greater than 6% are undersible because they tend to produce corrosion of the subsequently deposited metal layer. (The doping of typical materials such as CVD deposited oxide from a TEOS precursor is described in A. C. Adams, *VLSI Technology*, 2nd ed., S. M. Sze, editor, McGraw-Hill, New York, 1988, Chapter 6.)

Sufficient smoothing material is formed so that its exposed surface is relatively smooth, i.e. 90% of its surface makes an angle of less than 10 degrees (lesser included angle) relative to an imaginary plane parallel to the surface of the substrate before device processing. Generally, to yield a smooth surface with materials such as polysilicates, a layer with a nominal thickness of 1500 to 6000 Å is formed. (Nominal thickness is the thickness formed on a flat surface when an equivalent formation process is used.)

The thickness employed depends on the degree of smoothing required and the degree of nonplanarity of the underlying layer. A controlled sample is easily used to determine a suitable thickness for a given device configuration. Formation of smoothing layers such as polysilicate smoothing layers is generally accomplished by spin depositing onto the substrate from a sol in a low molecular weight polar solvent. (Details of spinning procedures are found in L. F. Thompson and M. J. Bowden, *Introduction to Microlithography*, L. F. Thompson, et al., editors, ACS Symposium Series 219; American Chemical Society: Washington, D.C. 1983, Chapter 4.) After the polysilicate is formed, it is completely removed by wet etching. Typical wet etchants employed are aqueous HF etchants. Such etchants yield desired matching of etching rates between materials such as polysilicates and typical underlying device materials. For typical polysilicate thicknesses, etching times typically in the range 4 to 25 minutes for temperatures in the range 20° to 25° C. are employed to totally remove the polysilicate material and a portion of the underlying material to yield a smoothed surface. Etching is typically effected by the simple expedient of immersion of the substrate in the etchant. However, other etching techniques such as spray or vapor-phase etching are not precluded.

After smoothing of the surface, further device fabrication operations are performed such as etching of contact holes in the oxide followed by deposition of an aluminum layer with subsequent patterning of this aluminum layer to form a conductive network for device interconnection. (Typical techniques for deposition and patterning of aluminum are discussed in Sze, supra, Chapters 4 and 5).

The following examples are illustrative of processing conditions employed with procedures associated with the invention.

EXAMPLE 1

A material obtained from Allied Chemicals, Milpetas, Calif. (a subsidiary of Allied Signal Incorporated) was employed. This material was formed through the nitric acid catalyzed hydrolysis of TEOS in a 1:1 mixture of acetone and 2-propanol. This combination gave a dense silicate polymer having a molecular weight of approximately 2000. The final solution included 30 weight % acetone, 25.2 weight % ethanol, 30 weight % 2-propanol, 6.7 weight % water and 8.1 weight % silicon dioxide. Additionally, a similar sample was made except during the formation of the polysilicate sol 0.5 mole percent (relative to silicon) of phosphorus was added in the form of phosphorus pentoxide.

A silicon wafer measuring five inches in diameter and having its major surface in the (100) crystallographic plane was employed. Between 0.5 and 1 mL of either the undoped polysilicate or the doped polysilicate was placed approximately in the center of the wafer. The wafer was rapidly accelerated to a speed approximately 3000 rpm and was maintained at this speed for approximately 10 seconds. Within one second of deacceleration, the coated substrate was placed on a hot plate that had been preheated to 100° C. After 60 seconds, the wafer was transferred to a hot plate preheated to 200° C. and then after 60 seconds, the wafer was tranferred to a hot plate preheated to 200° C. and then additional 60 seconds. An oxygen atmosphere was established by flowing approximately 15 sccm of oxygen through a quartz furnace heated to 800° C. The wafer was transferred to the quartz tube furnace for approximately 15 minutes. (Treatment for less than 15 minutes typically resulted in a cracking of the silicate after subsequent processing. However, heat treatment times longer than 15 minutes were satisfactory.) After heat treatment for 15 minutes, the same coating procedure including spinning and hot plate treatments was employed. The wafer was transferred to the quartz tube furnace for an additional 45 minutes.

The thickness uniformity of the resulting smoothing layer was measured utilizing a PROMETRIX SpectraMap®. A probe of 49 sites was employed. The coated layer had a mean thickness of 4244 Å, a minimum thickness of 4172 Å, and a maximum thickness of 4283 Å yielding a standard deviation of 0.54%. The wafer was then immersed in the previously described 30:1 bath. The wafer was immersed at 24° C. for approximately 3 minutes. The remaining layer thickness was measured again with a probe of 49 sites and showed a mean thickness of 2449 Å, a minimum thickness of 2377 Å, and a maximum thickness of 2540 Å to yield a standard deviation of 1.73%.

The same procedure was followed for a series of 5 wafers and the results are shown in Table 1. The figures shown in this table are indicative of the amount of oxide removed.

TABLE 1

| Wafer # | Mean Å | σ % | Min Å | Max Å |
|---|---|---|---|---|
| 1 | 1809 | 1.54 | 1759 | 1863 |
| 2 | 1843 | 1.77 | 1769 | 1896 |
| 3 | 1802 | 2.89 | 1686 | 1879 |
| 4 | 1796 | 2.71 | 1704 | 1871 |
| 5 | 1886 | 2.02 | 1788 | 1941 |

EXAMPLE 2

The procedure of Example 1 was followed except the substrate had a series of test patterns on it designed to test properties associated with multilevel metallization configurations with an upper layer of CVD oxide formed from a TEOS precursor. This oxide was doped with approximately 5.9 weight % phosphorus. The thickness of this TEOS layer was approximately 1.3 μm.

The etching procedure described in Example 1 was followed where the etching rate was approximately 500 Å per minute and the etching time was approximately 18 minutes. This etching procedure was performed simultaneously on six different wafers all prepared and etched by the same procedure. The thickness of the oxide at 4 points around the substrate perimeter and at the substrate center was measured both before and after etching. Table II shows the means and standard deviation for each wafer of the 5 measurements for each wafer.

TABLE II

| Wafer # | Material Etched (Angstroms) | |
|---|---|---|
| | Mean | σ |
| 1 | 8459 | ±153 |
| 2 | 8485 | ±133 |
| 3 | 8532 | ±85 |
| 4 | 8513 | ±58 |
| 5 | 8457 | ±83 |
| 6 | 8251 | ±151 |

EXAMPLE 3

A wafer prepared as described in Example 2 was fractured. A cross-section of the fracture pattern was obtained using scanning electron microscopy. This measurement indicated that the surface was smoothed to 10 degrees or less over at least 90% of the surface.

EXAMPLE 4

Figure 2:
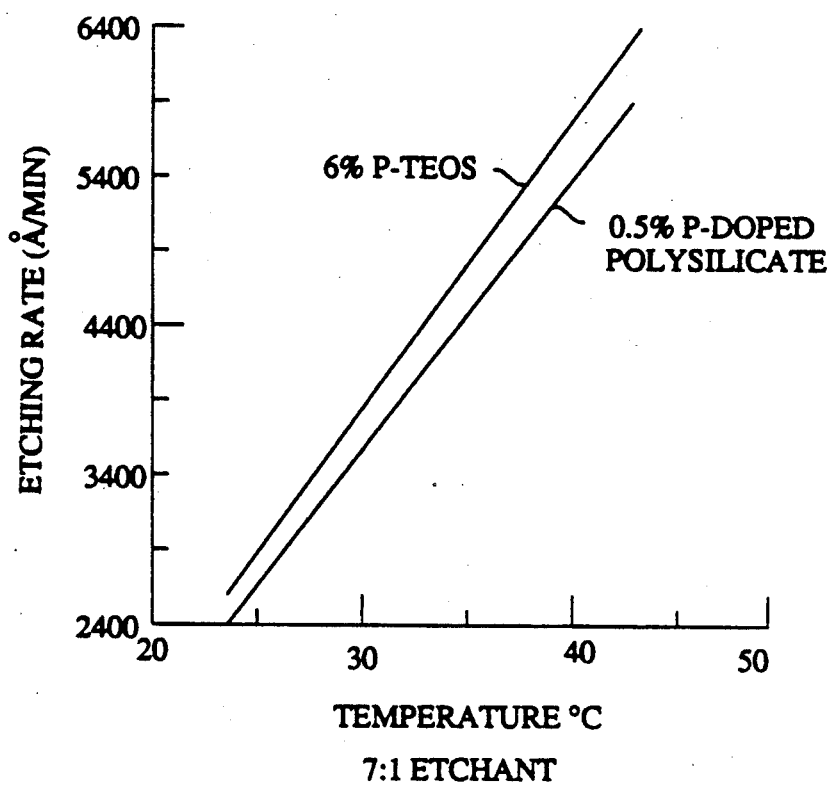
Figure 3:
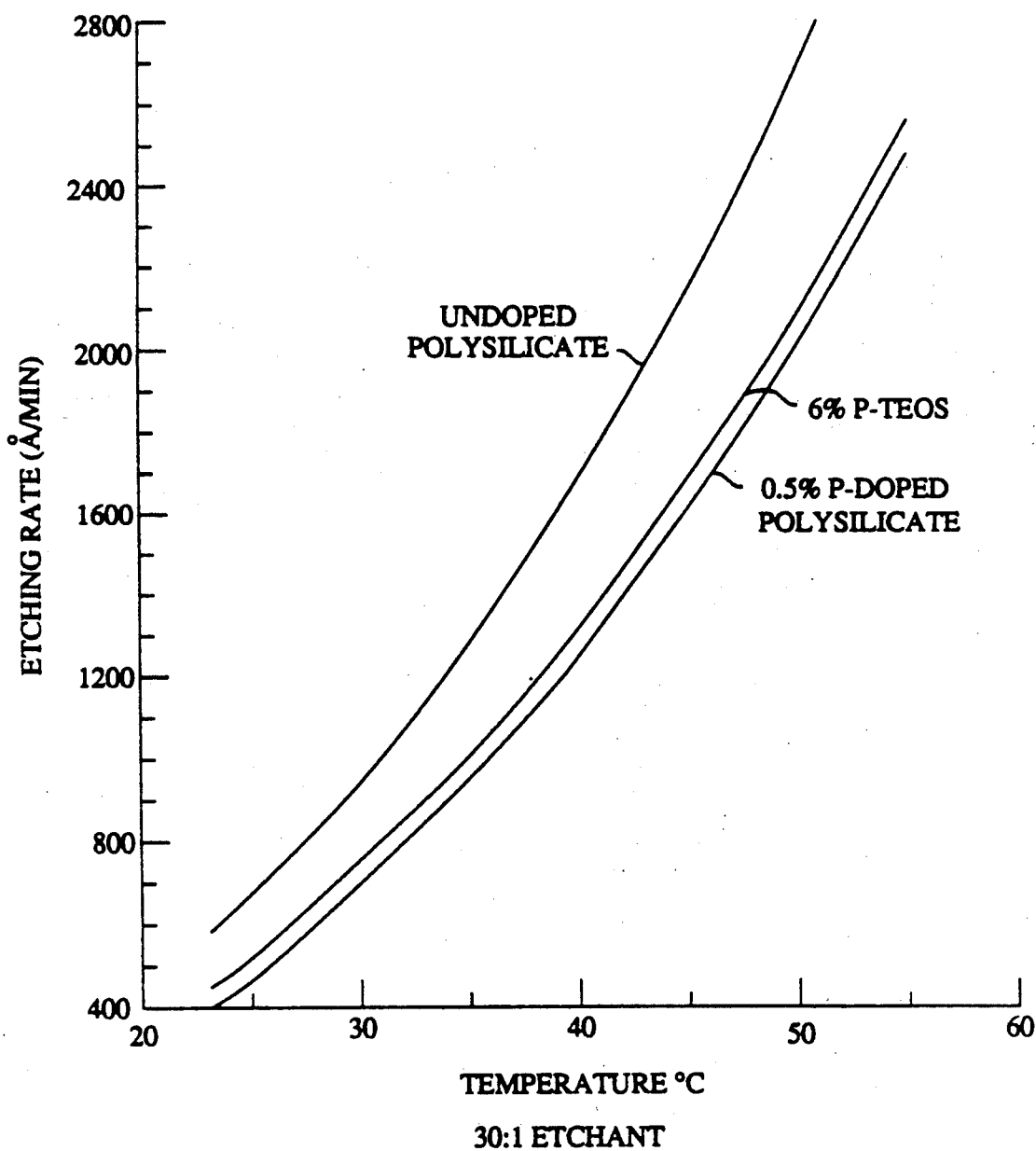

The procedure of Example 1 was followed for both doped and undoped polysilicate material except the wafer had a 1.3 μm thick layer of oxide formed by CVD TEOS deposition with a phosphorus dopant concentration of approximately 6 weight %. The etching rates for CVD TEOS oxide as a function of phosphorus dopant concentration in 30:1 etchant are shown in FIG. 1. The etching rates as a function of temperature for the phosphorus-doped polysilicate and 6 weight % phosphorus-doped CVD TEOS oxide in 7:1 etchant and in 30:1 etchant are shown in FIGS. 2 and 3, respectively. Additionally, the etching rates as a function of temperature for undoped polysilicate in 30:1 etchant are shown in FIG. 3. Etching rates in a 7:1 etchant as a function of curing temperature for undoped and doped polysilicate material are shown in Table III.

TABLE III

| CURE (°C.) | RATE (Å/min) |
|---|---|
| 425 | 7230 |
| 525 | 6112 |
| 625 | 4896 |
| 750 | 3246 |
| 810 | 2635 |
| 810 (4%B-doped) | 996 |
| 800 (0.5% P-doped) | 2195 |

We claim:

1. A process for fabricating an integrated circuit comprising the steps of fabricating device structures on a substrate to yield a nonplanar substrate surface, forming a region of smoothing material on said substrate surface, removing essentially all of said smoothing material and continuing the fabrication of said device characterized in that said removal is accomplished by wet etching wherein the wet etching removal rate of said smoothing material does not differ from the removal rate of said substrate by more than 20 % whereby said nonplanar substrate by more than 20% whereby said nonplanar substrate surface after said procedure is smoothed such that 90% of said surface of said substrate makes an angle of less than 10° relative to an imaginary plane parallel to said surface before processing of said device.

2. The process of claim 1 wherein said integrated circuit has a design rule of 1 μm or less.

3. The process of claim 2 wherein said smoothing material comprises a polysilicate.

4. The process of claim 3 wherein said etching is performed with aqueous HF.

5. The process of claim 2 wherein said surface of said substrate comprises a silicon oxide.

6. The process of claim 5 wherein said oxide contains a phosphorus dopant.

* * * * *

UNITED STATES PATENT AND TRADEMARK OFFICE
CERTIFICATE OF CORRECTION

PATENT NO. : 4,988,405

DATED : January 29, 1991

INVENTOR(S) : Edward P. Martin, Jr., Ronald J. Schutz, Gerald Smolinsky

It is certified that error appears in the above-identified patent and that said Letters Patent is hereby corrected as shown below:

Column 1, line 31, "involes" should read --involves--.
Column 4, line 22, "the wafer was transferred to a hot plate preheated to 200°C. and then additional 60 seconds." should read --was transferred to a hot plate preheated to 300°C for an additional 60 seconds--.
Column 6, line 31, "substrate by more than 20% whereby said nonplanar" should be deleted in its entirety.

Signed and Sealed this

Thirteenth Day of April, 1993

Attest:

STEPHEN G. KUNIN

*Attesting Officer*     *Acting Commissioner of Patents and Trademarks*